(12) United States Patent
Becklin

(10) Patent No.: US 9,604,763 B2
(45) Date of Patent: Mar. 28, 2017

(54) STACKABLE LIDS FOR EQUIPMENT CONTAINERS

(75) Inventor: Dennis M. Becklin, Grants Pass, OR (US)

(73) Assignee: Becklin Holdings, Inc., Reno, NV (US)

( * ) Notice: Subject to any disclaimer, the term of this patent is extended or adjusted under 35 U.S.C. 154(b) by 1179 days.

(21) Appl. No.: 13/081,171

(22) Filed: Apr. 6, 2011

(65) Prior Publication Data

US 2011/0180541 A1     Jul. 28, 2011

Related U.S. Application Data

(63) Continuation-in-part of application No. 12/244,668, filed on Oct. 2, 2008, now Pat. No. 7,688,584.

(51) Int. Cl.
| | |
|---|---|
| *B65D 85/62* | (2006.01) |
| *B65D 43/02* | (2006.01) |
| *H05K 7/20* | (2006.01) |
| *B65D 85/38* | (2006.01) |

(52) U.S. Cl.
CPC ......... *B65D 43/0202* (2013.01); *H05K 7/202* (2013.01); *H05K 7/20563* (2013.01); *B65D 85/38* (2013.01); *B65D 2543/00027* (2013.01)

(58) Field of Classification Search
USPC ....... 206/515, 516, 518, 519, 520, 517, 511; 220/324, 212.5
See application file for complete search history.

(56) References Cited

U.S. PATENT DOCUMENTS

| | | | | |
|---|---|---|---|---|
| 3,464,579 | A  * | 9/1969 | Asenbauer | 220/4.21 |
| 5,370,254 | A  * | 12/1994 | Hardigg et al. | 220/4.22 |
| 6,889,838 | B2 * | 5/2005 | Meier et al. | 206/508 |
| 2009/0173656 | A1* | 7/2009 | Furlong | 206/508 |
| 2010/0000893 | A1* | 1/2010 | Twig et al. | 206/373 |
| 2011/0139777 | A1* | 6/2011 | Sosnovsky et al. | 220/23.83 |

FOREIGN PATENT DOCUMENTS

JP          62022946       *  2/1987

* cited by examiner

*Primary Examiner* — Jeffrey Allen
(74) *Attorney, Agent, or Firm* — Lowe Graham Jones PLLC

(57) ABSTRACT

A lid for a transit case includes alignment features such as protuberances and alignment guides that cooperate to permit multiple lids to be stacked in a stable configuration and in a space efficient manner one on top of another. The lids may take the form of deep-profile lids and low-profile lids. In addition, the lids may include features for receiving and securing extra latch assemblies or other hardware on an interior surface of the lid.

1 Claim, 7 Drawing Sheets

STACKABLE LIDS FOR EQUIPMENT CONTAINERS

PRIORITY CLAIM

This application is a continuation-in-part of U.S. patent application Ser. No. 12/244,668 filed on Oct. 2, 2008 now U.S. Pat. No.7,688,584, the subject matter of which is incorporated herein by reference in its entirety.

FIELD OF THE INVENTION

This invention relates to lids or covers used on containers for storing and transporting products, such as electronics equipment, and more specifically, to stackable lids or covers.

BACKGROUND OF THE INVENTION

Various types of transit containers, which may take the form of rack-mount style containers, are employed to receive and support delicate cargo, such as but not limited to electronic, computer, optical and other types of equipment. These containers are often used in military and commercial environments and may be handled by persons, loading equipment, or both. At times, the containers may receive delicate equipment and as such the containers and their respective lids or covers may cooperate to ensure they are fully enclosed, water tight, and sealed from sand, dust and chemical warfare agents. In addition, the containers and lids must withstand a variety of loading conditions, such as but not limited to static, impact, thermal and vibrational loads.

It is often desirable to stack the containers and their lids during storage and while loading or unloading the container to effectively utilize the available space, such as within a storage facility, a transport vehicle or a loading platform. A variety of containers are known that provide some stacking capability, including but not necessarily limited to the containers described in U.S. Pat. No. 6,457,599 to Apps et al.; U.S. Pat. No. 6,237,758 to Hsu; U.S. Pat. No. 6,186,345 to Robertson; U.S. Pat. No. 6,085,467 to Packrall et al.; U.S. Pat. No. 5,769,230 to Koefelda; U.S. Pat. No. 5,203,494 to Blomfield; and U.S. Pat. No. 4,655,360 to Juhanson.

SUMMARY OF THE INVENTION

A container, such as a transit, rack-mount style or other type of container, generally configured to receive equipment, includes at least one lid having features that permit the lid to be effectively and conveniently stacked with other like lids from other containers. In one embodiment, a first lid includes at least one pair of protuberances extending from an exterior surface of the first lid and an alignment guide mounted to an interior surface of the first lid. The protuberances are configured to receive an alignment guide from another lid when it is stacked onto a ledge of the first lid. Thus, lids having these protuberances, alignment guides and ledges may be successively stacked one on top of another in a manner that saves space while also allowing the lids to be easily separated when they need to be re-installed onto a container. In another embodiment, a lid includes at least one protuberance extending outwardly from an exterior surface of the lid and elongated to extend approximately between a ledge and an engagement surface of the lid. The lids, as briefly summarized above, may have different depth profiles, meaning some lids may deep-profile lids while others may be low-profile lids.

In one example of the invention, a lid for a centerbody of a container includes a molded exterior surface, a corresponding inner surface and a contact surface configured to substantially contact a corresponding surface of the centerbody; an alignment guide having a first portion mounted to the inner surface and a second portion extending below the contact surface; a ledge formed in the molded exterior surface, the ledge arranged to support an alignment guide of a complementary lid receivable by the lid; and a pair of protuberances extending from the molded exterior surface adjacent the ledge, the pair of protuberances configured to receive the alignment guide of the complementary lid and thus align the complementary lid with the lid from the container.

In another example of the invention, a container includes a centerbody having an interior compartment sized to receive equipment and having a lid engagement surface; and at least one lid latchably removable with the centerbody. The lid includes an exterior surface, a corresponding inner surface and a centerbody engagement surface configured to substantially contact the lid engagement surface of the centerbody; an alignment guide having a first portion mounted to the inner surface and a second portion extending below the centerbody engagement surface; a ledge formed in the molded exterior surface; and a pair of protuberances extending from the molded exterior surface adjacent the ledge, the pair of protuberances having a spaced apart distance to receive the alignment guide of the complementary lid.

In yet another example of the invention, a method for stacking lids removed from containers includes placing a first lid on a substantially planar surface, the first lid having first alignment guides for contacting the substantially planar surface, the first lid further having at least one pair of protuberances extending from an exterior surface of the first lid and having a substantially planar ledge located proximate the at least one pair of protuberances; and stacking a second lid onto the first lid, the second lid having a second alignment guide insertable between a spaced apart region formed by the pair of protuberances of the first lid, the second alignment guide supported by the substantially planar ledge of the first lid. In one embodiment, the second alignment guide cooperates with the at least one pair of protuberances to align the second lid with the first lid in a stacked configuration.

In yet another example of the invention, a lid for a centerbody of a container includes a molded exterior surface, a corresponding inner surface and a contact surface configured to substantially contact a corresponding surface of the centerbody; a ledge formed in the molded exterior surface, the ledge arranged to support an alignment guide of another lid receivably stacked onto the lid; and an alignment guide having a first portion mounted to the inner surface and a second portion extending below the contact surface.

BRIEF DESCRIPTION OF THE DRAWINGS

The preferred and alternative embodiments of the present invention are described in detail below with reference to the following drawings.

DETAILED DESCRIPTION OF THE PREFERRED EMBODIMENT

In an example of the present invention, a lid for a transit case includes alignment features such as protuberances and alignment guides that cooperate to permit multiple lids to be stacked in a stable configuration in a space efficient manner. The lids may take the form of deep-profile lids and low-profile lids. In addition, the lids may include features for receiving and securing extra latch assemblies or other hardware on an interior surface of the lid.

Figure 1:
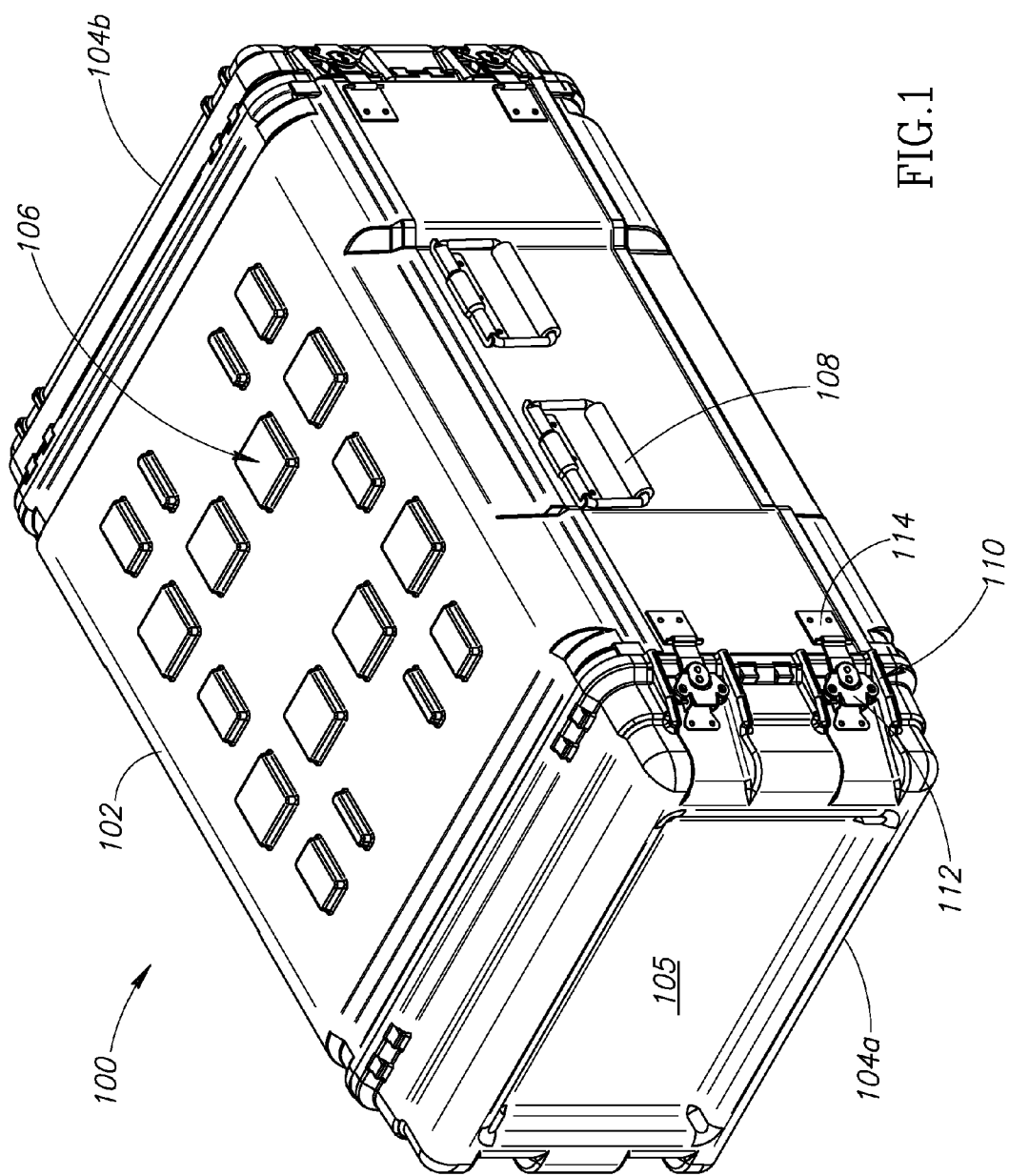
FIG. 1 shows a perspective view of a container having stackable lids of a low-profile type and a deep-profile type attached to a centerbody of the container according to an embodiment of the present invention.

FIG. 1 shows a container system 100 having a centerbody 102 latched to stackable lids 104, each lid having an exterior surface 105. The centerbody 102 includes stackable elements 106 arranged to permit aligned and secure stacking of multiple containers on top of one another. By way of example, the centerbody 102 may take the form of the centerbody described in U.S. Patent Publication No. 2006/0254946. In addition, the centerbody 102 may include handles 108 hingedly coupled to the centerbody and having hand-grippable portions. In the illustrated embodiment, the centerbody 102 latches to the stackable lids 104 with latch assemblies 110, each of which includes a movable latch portion 112 that engages a strike plate 114.

Figure 4:
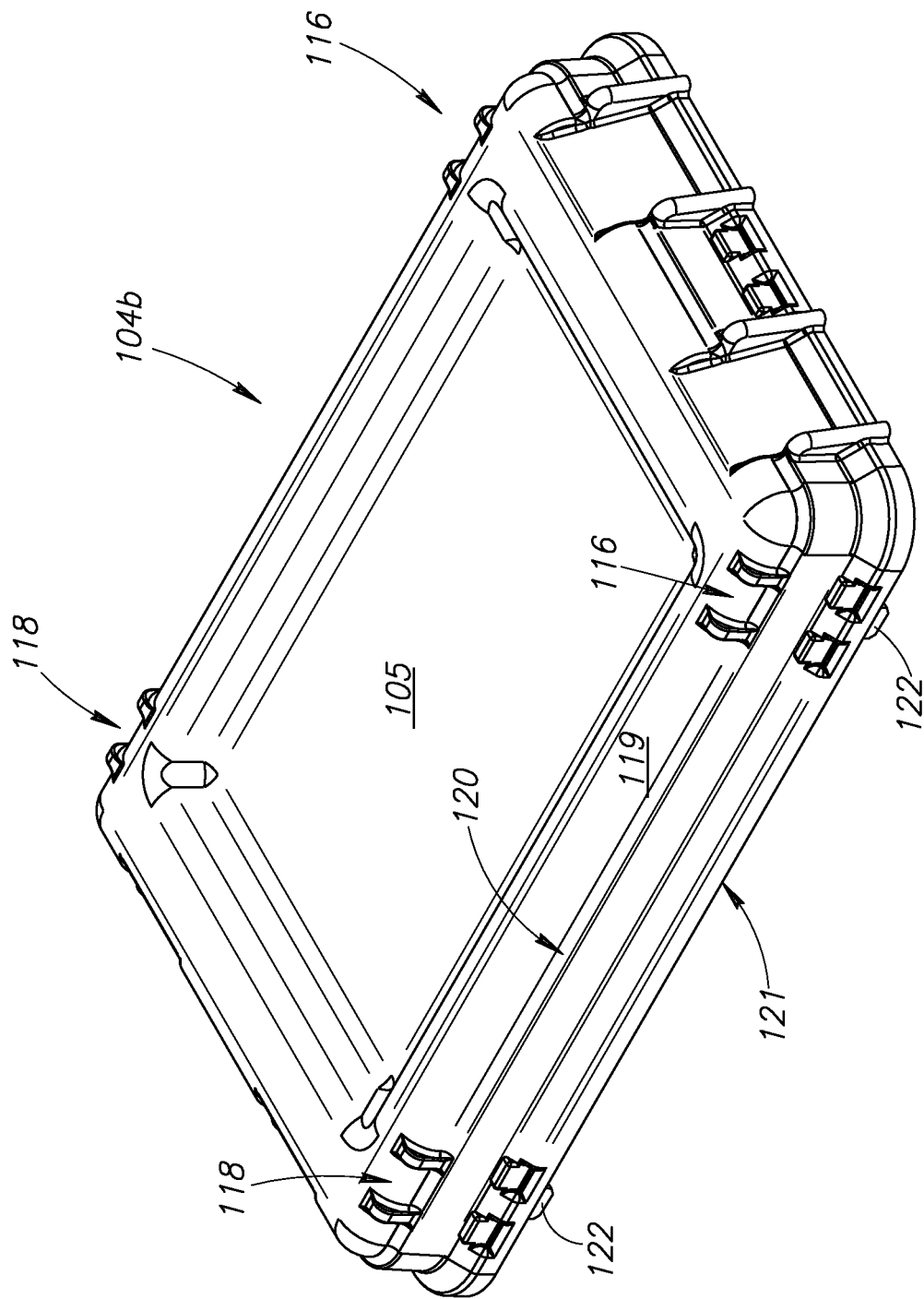
FIG. 4 shows an isometric view of a low-profile lid for a container having protuberances and alignment guides according to an embodiment of the present invention.

The stackable lids 104 may be attached to the centerbody 102 to prevent ingress of undesirable water, dust, chemical agents or other debris. In one embodiment, the stackable lids 104 are attached to the centerbody 102 with seals (not shown) that are located adjacent to a contact or engagement surface 121 (FIG. 4). Compression of the seals may be accomplished by operation of the latch assemblies 110.

Figure 2:
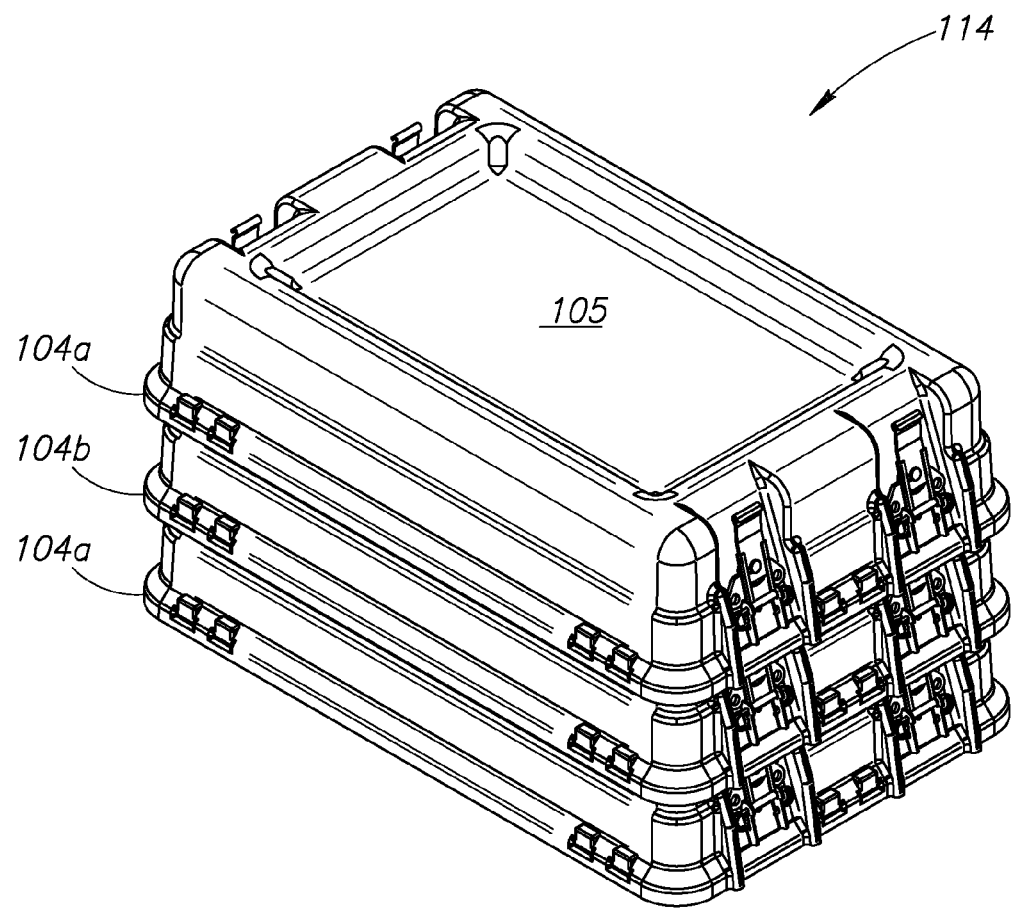
FIG. 2 shows a perspective view of a number of lids in a first stacked configuration according to an embodiment of the present invention.

FIG. 2 shows the stackable lids 104a, 104b arranged in a stacking configuration 114. Of the three stacked lids, the stackable lids 104a take the form of deep-profile lids and the stackable lids 104b take the form of low-profile lids. In one embodiment, the deep-profile lids 104a have a depth (i.e., vertical stacking height) of greater than about three inches, and preferably about four to five inches; whereas the low-profile lids have a depth not greater than about three inches. Due to the increased depth of the deep-profile lids 104a, these lids may not include alignment guides and may have protuberances arranged with a configuration and in a manner different from the low-profile lids 104b. For purposes of this description, the low-profile lid 104b is described generally with reference to FIGS. 1-7 and the deep-profile lid 104a is described generally with reference to FIG. 8. Nevertheless, it is appreciated that aspects and features of the different lid types may be combined or otherwise modified to generate other lid configurations within the scope of the claimed invention.

Figure 3:
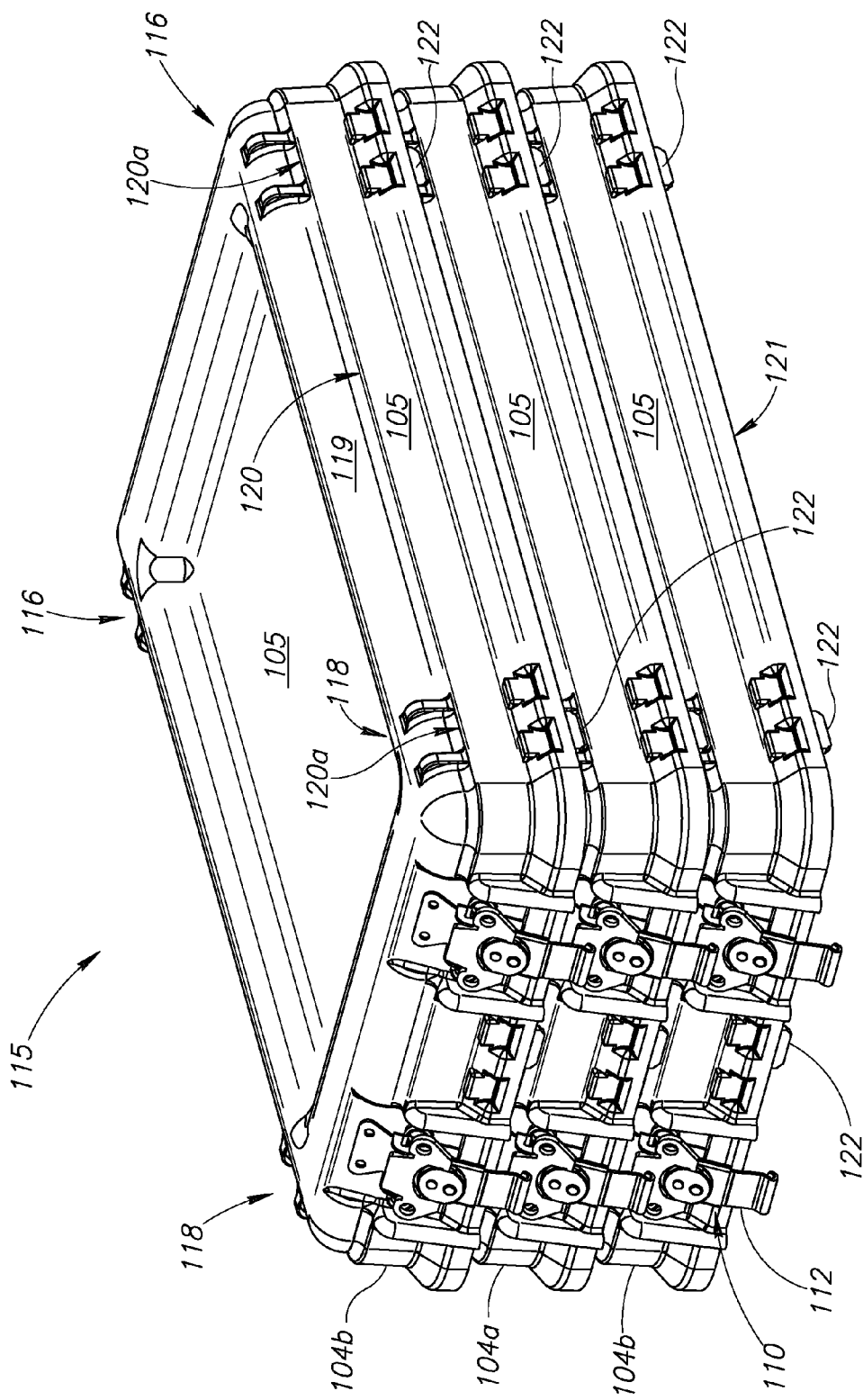
FIG. 3 shows a perspective view of a number of lids in a second stacked configuration according to an embodiment of the present invention.

FIG. 3 shows the stackable lids 104a, 104b arranged in a different stacking configuration 115 in which the deep-profile lid 104a is located between two low-profile lids 104b. The focus of the description herein will be toward the stackable lid 104b.

Now referring to both FIGS. 3 and 4, the stackable lid 104b includes first and second pairs of protuberances 116, 118, respectively. The protuberances 116, 118 extend outward from a rounded corner portion 119 of an exterior surface 105 of the lid 104b. In addition, the stackable lid 104b includes a ledge or shoulder 120. In the illustrated embodiment, the ledge 120 extends continuously along the side of the lid 104b and forms a planar base 120a between the individual ears forming the protuberance pairs 116, 118, respectively. The stackable lid 104b further includes alignment guides 122 sized to be received by the respective pairs of protuberances 116, 118. The alignment guides 122 extend past a contact or engagement surface 121 of the lid 104b. The contact surface 121 contacts or engages the centerbody 102 (FIG. 1) when the lid 104b is installed thereon.

When the lids are stacked together, the alignment guides 122 become seated on the ledge 120a of another lid to support the weight of the lid 104b. For the lowermost lid 104b in the stacked configuration 115, the alignment guides 122 may contact a support surface, such as, but not limited the ground, a table, or some other horizontal surface.

Figure 5:
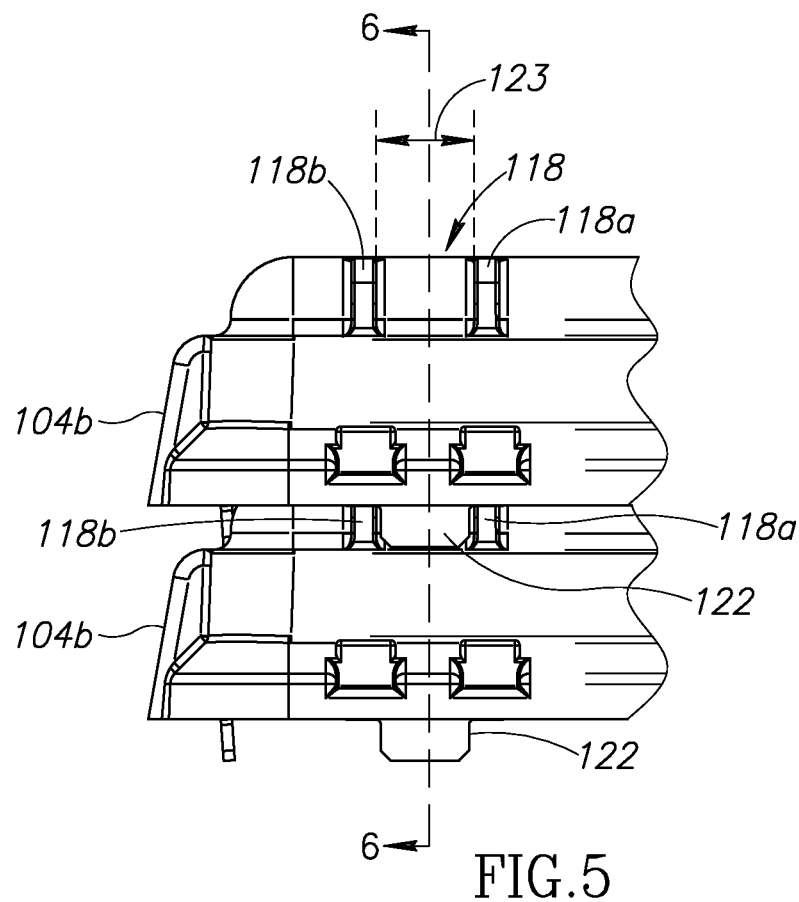
FIG. 5 shows a side elevational, partial view of two low-profile lids stacked on top each other, each lid includes protuberances and alignment guides according to an embodiment of the present invention.
Figure 6:
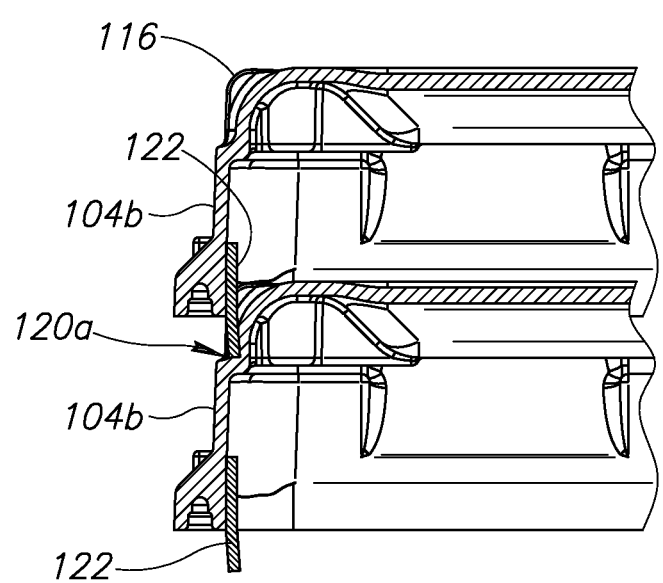
FIG. 6 shows a cross-sectional view of the stacked lids of FIG. 5 taken along line 6-6 of FIG. 5.

FIG. 5 shows two low-profile lids 104b stacked on top of one another. The alignment guide 122 of the upper lid is sized to be closely received between ears 118a, 118b that form the second pair of protuberances 118 of the lower lid. As such, the ears 118a, 118b are spaced apart by a gap 123 that is preferably slightly greater than a width of the alignment guide 122 being received. FIG. 6 shows a close-up cross-sectional view of the stacked, low-profile lids 104b from FIG. 5 with the alignment guide 122 of the upper lid seated on the ledge 120a of the lower lid. The alignment guides 122 may be substantially planar or may include some amount of curvature.

Figure 7:
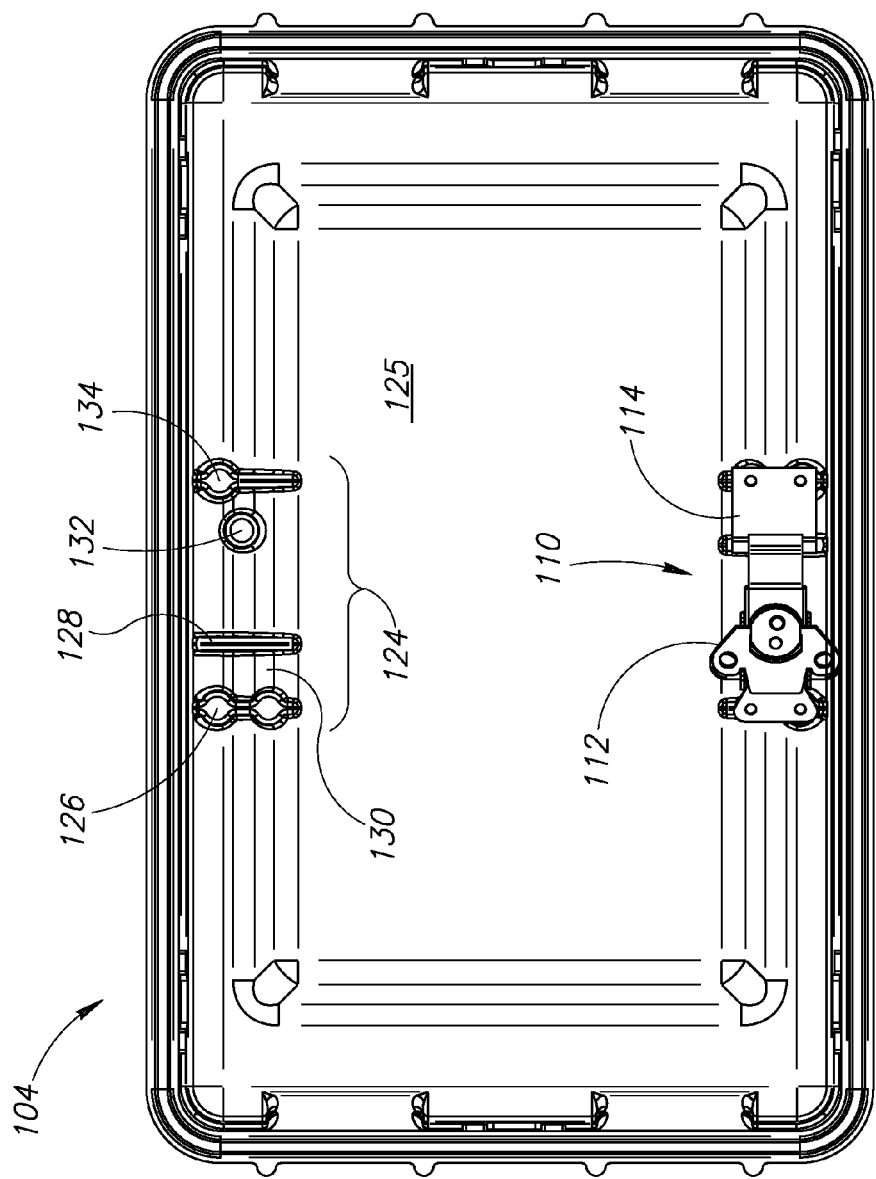
FIG. 7 shows an interior surface of the low-profile lid of FIG. 4.

FIG. 7 shows an interior surface 125 of the lid 104b. In the illustrated embodiment, the lid 104b includes features 124 for receiving and storing a latch assembly 110 comprised of the movable latch portion 112 and the strike plate 114. In the illustrated embodiment, the features 124 take the form of molded features integrally formed with the lid 104b. More specifically, the features 124 include latch portion mounting features 126 and 128 configured with a recess located there between. The features 126 and 128 are configured to engage and secure the latch portion 112; whereas the recess 130 may be used to store other latch related or non-latch related hardware items. In addition, the features 124 include strike plate mounting features 132, 134 configured to engage and secure the strike plate 114 of the latch assembly 110. In short, the features 124 permit extra latches to be secured within the lid 104b such that one or both portions of one of the operational latch assemblies 110 may be replaced in the event of breakage or damage thereto. Although the features 124 are described as being molded with the lid 104b, it is appreciated that the features 124 may be separate components and attached to the interior surface 125 of the lid 104b by other means, such as, but not limited to, fastening, bonding, etc. Moreover, the features 124 may be located on various regions on the interior surface 125, and hence their location shown in the illustrated embodiment is merely for exemplary purposes.

Figure 8:
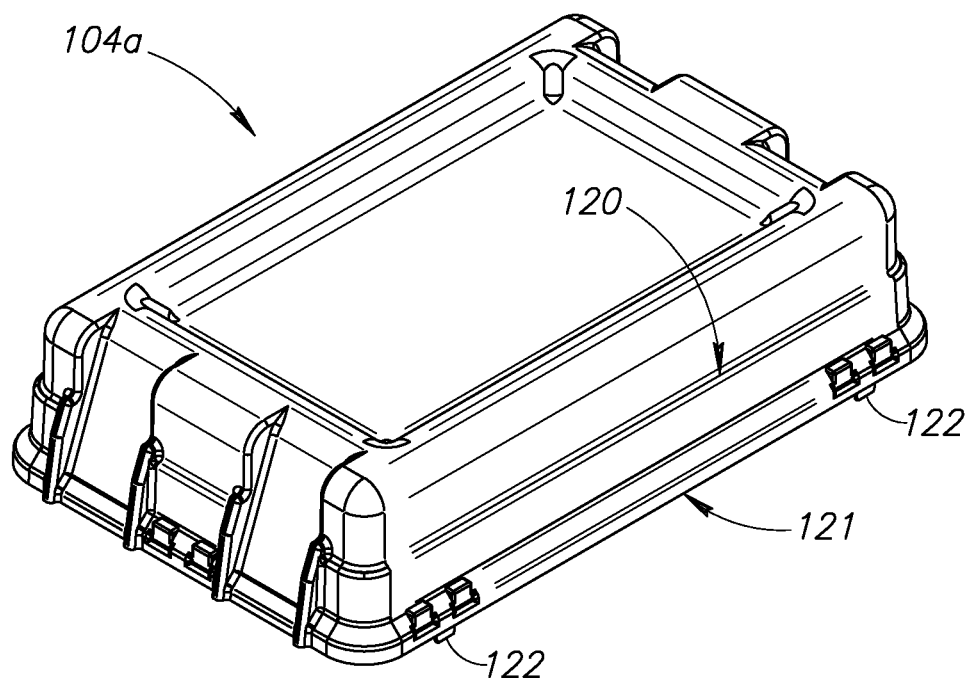
FIG. 8 shows an isometric view of a deep-profile lid having alignment guides extending below a bottom surface of the lid according to an embodiment of the present invention.

FIG. 8 shows the deep-profile lid 104*a* having the ledge 120 and an engagement surface 121. The lid 104*a* includes alignment guides 122 arranged to fit within the gaps 123 formed by the pairs of protuberances 116, 118 (FIG. 4) of the low-profile lid 104*b* (FIG. 3). Alternatively, if two or more deep-profile lids 104*a* are stacked one on top of the other, then the alignment guides 122 are supported on the ledges 120 of each lowermost lid 104*a*. The primary difference between the deep-profile lids 104*a* and the low-profile lids 104*b* is the former has an overall depth of the lid 104*a* that is sufficient to permit stabilized stacking of these lids without the need for the protuberances 116, 118 (FIG. 4).

While the preferred embodiment of the invention has been illustrated and described, as noted above, many changes can be made without departing from the spirit and scope of the invention. Accordingly, the scope of the invention is not limited by the disclosure of the preferred embodiment. Instead, the invention should be determined entirely by reference to the claims that follow.

The embodiments of the invention in which an exclusive property or privilege is claimed are defined as follows:

1. A lid for a centerbody of a container, the lid comprising:
    a molded exterior surface, a corresponding inner surface and a contact surface configured to substantially contact a corresponding surface of the centerbody;
    an alignment guide having a first portion mounted to the inner surface and a second portion extending below the contact surface;
    a ledge formed in the molded exterior surface, the ledge arranged to support an alignment guide of a complementary lid receivable by the lid; and
    a pair of protuberances extending from the molded exterior surface adjacent the ledge, the pair of protuberances spaced apart sufficiently to receive the alignment guide of the complementary lid and thus align the complementary lid with the lid from the container,
    wherein the first portion is positioned inwardly from the contact surface; and
    wherein the alignment guide is a substantially planar member and the pair of protuberances are arranged to receive the alignment guide of the complementary lid and thus align the complementary lid with the lid from the container by engaging opposite edges of the planar member.

* * * * *